(12) United States Patent
Hooper et al.

(10) Patent No.: US 11,498,829 B2
(45) Date of Patent: Nov. 15, 2022

(54) NO-GEL PRESSURE SENSOR PACKAGE

(71) Applicant: NXP USA, Inc., Austin, TX (US)

(72) Inventors: Stephen Ryan Hooper, Mesa, AZ (US); Mark Edward Schlarmann, Chandler, AZ (US); Michael B. Vincent, Chandler, AZ (US); Scott M. Hayes, Chandler, AZ (US); Julien Juéry, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 366 days.

(21) Appl. No.: 16/744,577

(22) Filed: Jan. 16, 2020

(65) Prior Publication Data
US 2021/0221671 A1 Jul. 22, 2021

(51) Int. Cl.
*B81B 3/00* (2006.01)
*G01L 9/00* (2006.01)

(52) U.S. Cl.
CPC .......... *B81B 3/0018* (2013.01); *G01L 9/0072* (2013.01); *B81B 2201/0264* (2013.01); *B81B 2203/0118* (2013.01); *B81B 2203/0172* (2013.01)

(58) Field of Classification Search
CPC .......... B81B 3/0018; B81B 2201/0264; B81B 2203/0118; B81B 2203/0172; B81B 7/0048; B81B 7/0058; B81B 7/02; G01L 9/0072; G01L 9/0073; G01L 1/00; G01L 19/00; B81C 1/00261
See application file for complete search history.

(56) References Cited

U.S. PATENT DOCUMENTS

| | | | |
|---|---|---|---|
| 6,401,545 B1 | 6/2002 | Monk et al. | |
| 8,049,287 B2 | 11/2011 | Combi et al. | |
| 8,304,275 B2 | 11/2012 | Schlarmann et al. | |
| 8,686,550 B2 | 4/2014 | McDonald et al. | |
| 9,146,170 B2 | 9/2015 | Wen et al. | |
| 9,446,940 B2 | 9/2016 | Dawson et al. | |
| 9,663,350 B2 | 5/2017 | Hooper et al. | |
| 10,267,660 B2 | 4/2019 | Umetsu | |
| 2017/0278768 A1 | 9/2017 | Higgins, III | |
| 2018/0148322 A1* | 5/2018 | Maier | B81C 1/00301 |

* cited by examiner

*Primary Examiner* — Elias Ullah (57) ABSTRACT

A no-gel sensor package is disclosed. In one embodiment, the package includes a microelectromechanical system (MEMS) die having a first substrate, which in turn includes a first surface on which is formed a MEMS device. The package also includes a polymer ring with an inner wall extending between first and second oppositely facing surfaces. The first surface of the polymer ring is bonded to the first surface of the first substrate to define a first cavity in which the MEMS device is contained. A molded compound body having a second cavity that is concentric with the first cavity, enables fluid communication between the MEMS device and an environment external to the package.

15 Claims, 8 Drawing Sheets

NO-GEL PRESSURE SENSOR PACKAGE

BACKGROUND

Microelectromechanical system (MEMS) are semiconductor devices with embedded mechanical components. MEMS devices include, for example, pressure sensors, accelerometers, gyroscopes, microphones, digital mirror displays, micro fluidic devices, and so forth. MEMS devices, including pressure sensor devices, can be used in a wide range of applications. The present disclosure will be described with reference to a MEMS pressure sensor (hereinafter pressure sensor), it being understood the present disclosure should not be limited thereto.

There are significant challenges in the packaging of pressure sensors due at least in part to the necessity for the pressure sensors to interact with the outside environment, the fragility of many types of pressure sensors, and severe cost constraints. Indeed, many pressure sensor device applications require smaller size and low cost packaging to meet aggressive cost targets.

DETAILED DESCRIPTION

Typical pressure sensors packaging involves placing a pressure sensor in a cavity-type package made of a non-conductive material. The cavity package reduces, or eliminates, stresses on the pressure sensor, which can alter the performance of the pressure sensor in an indeterminable manner Creating the cavity for the pressure sensor, however, presents challenges.

Pressure sensors are available in many different configurations, which can be packaged in different ways, using different manufacturing processes. The present disclosure will be described with reference to the manufacture and packaging of a stress-isolated pressure sensor (hereinafter stress-isolated Pcell) die, it being understood the present disclosure should not be limited thereto.

Figure 1:
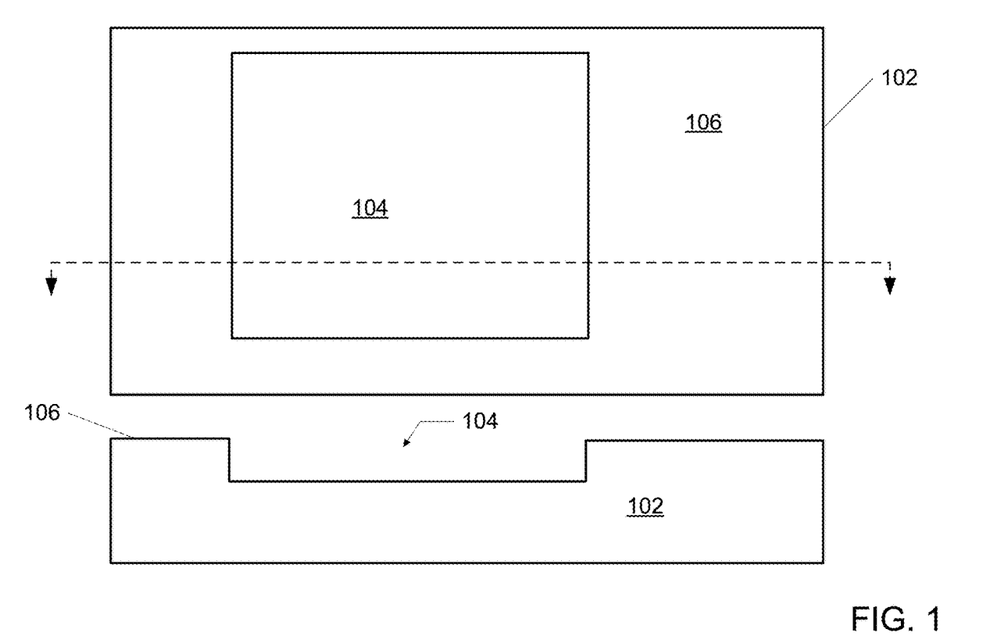
FIG. 1 shows a top view and a side sectional view of a substrate.

FIG. 1 shows a top view and a side sectional view of first substrate 102 contained in a wafer (not shown) at an initial stage of a process for manufacturing and packaging a stress-isolated Pcell die. First substrate 102 is etched using known techniques to form a corresponding recess 104. In particular, recess 104 is etched from surface 106 into first substrate 102 to depth that is less than thickness of first substrate 102.

Figure 2:
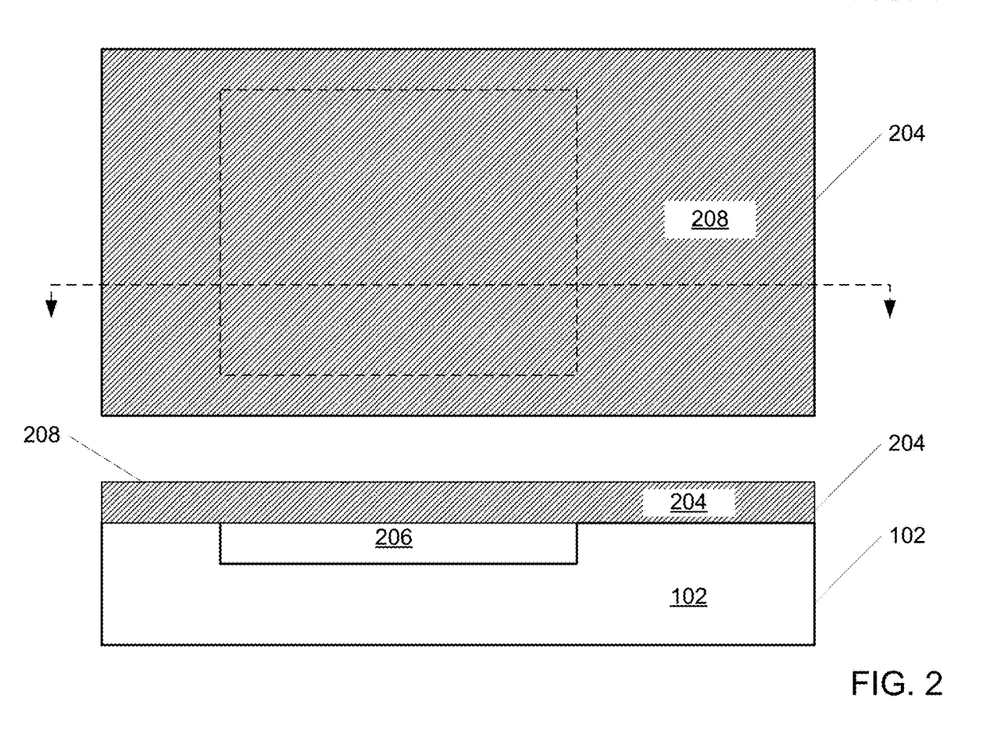
FIG. 2 shows a top view and a side sectional view of the structure of FIG. 1 at a subsequent stage of the manufacturing process.

FIG. 2 shows a top view and a side sectional view of the structure of FIG. 1 at a subsequent stage of the manufacturing process. A wafer (not shown) containing a second substrate 204 is attached to surface 106 of the first substrate 102 so that recess 104 is interposed between second substrate 204 and first substrate 102. In an embodiment, second substrate 204 may be included in a crystalline wafer that is attached to the wafer containing first substrate 102 using a silicon on insulator (SOI) process, fusion bonding, or another similar process. Following attachment of second substrate 204 to first substrate 102, a buried cavity or recess 206 is formed.

Figure 3:
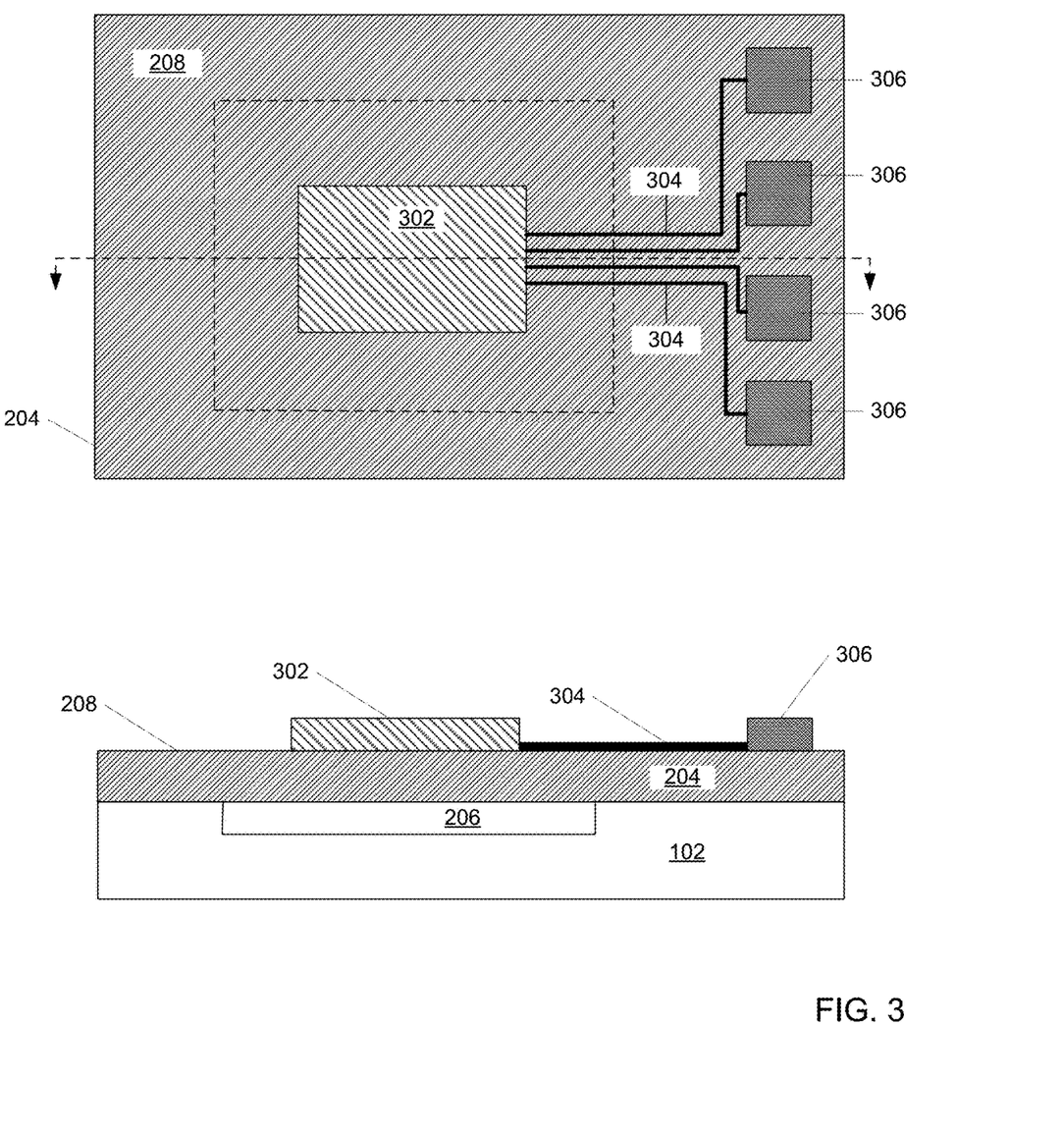
FIG. 3 shows a top view and a side sectional view of the structure of FIG. 2 at a subsequent stage of the manufacturing process.

FIG. 3 shows a top view and a side sectional view of the structure of FIG. 2 at a subsequent stage of the manufacturing process. A MEMS pressure sensor device 302 (hereinafter pressure sensor device), conductive traces 304, and bond pads 306 are formed on a surface 208 of second substrate 204. In some embodiments, MEMS pressure sensor device 302 may be built on second substrate 204 using, for example, a surface micromachining process to form a capacitive pressure sensor. In one embodiment, device 302 could be created by forming a layer polysilicon (not shown) on substrate 204. A sacrificial layer (not shown) is then formed on the top of the layer of polysilicon. Another layer of polysilicon (not shown) is formed on top of the sacrificial layer. Then the sacrificial layer is removed, creating parallel plates of polysilicon, the top of which can flex with changes in fluid pressure to which it is exposed. The changes in the distance between the parallel plates causes a change in the capacitance therebetween, which can be measured and converted into pressure data. Conductive traces 304 and bond pads 306 may be fabricated in connection with the fabrication of the MEMS pressure sensor device 302. Metal deposition, patterning, and etching may be performed to form bond pads 306. Conductive traces 304 interconnect MEMS pressure sensor device 302 with bond pads 306 to form suitable electrical connections. Other fabrication activities may be performed per convention that are not discussed or illustrated herein for clarity of description.

Figure 4:
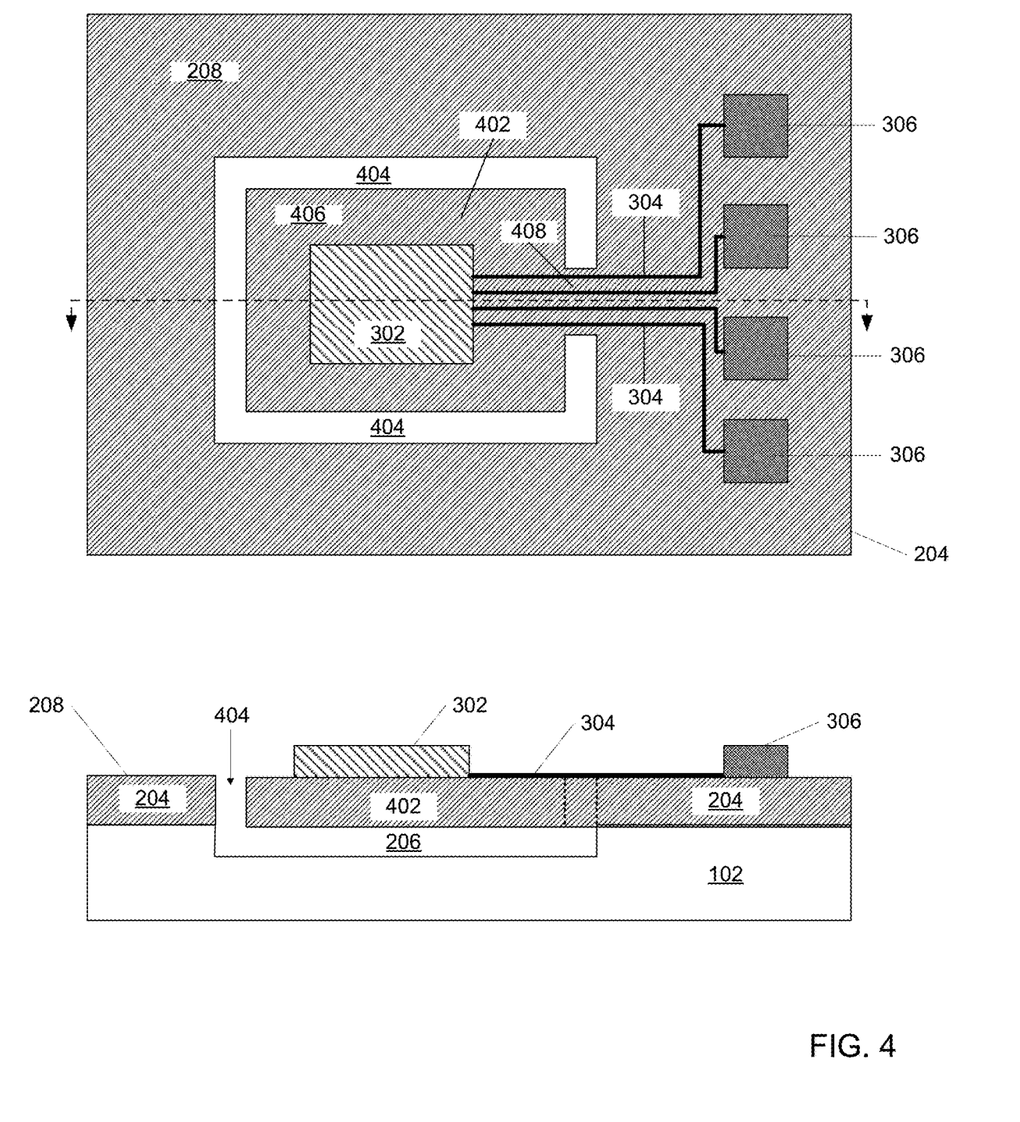
FIG. 4 shows a top view and a side sectional view of the structure of FIG. 3 at a subsequent stage of the manufacturing process.

FIG. 4 shows a top view and a side sectional view of the structure of FIG. 3 at a subsequent stage of the manufacturing process. A portion of the second substrate 204 is etched or otherwise removed to form cantilevered platform structure 402. By way of example, a mask (not shown) may be used to cover or otherwise protect those regions of second substrate 204 that are not to be etched. As such, the mask provides a pattern for forming openings 404 through second substrate layer 204 and for producing cantilevered platform structure 402 consisting of a platform 406 and arm 408. The removal process may be performed using any of a number of known etching processes to create cantilevered platform structure 402. FIG. 4 represents the outcome of the etching process so that opening 404, and consequently cantilevered platform structure 402, are formed. Note that conductive traces 304 are suitably routed so that they reside on arm 408 in order to interconnect pressure sensor device 302 with bond pads 306.

Pressure sensor devices (e.g., pressure sensor device 302) are often contained in cavities to protect them from influence of package stress. A crystalline silicon cap (not shown) over a cavity that contains a pressure sensor device could also be used to protect it from environmental stresses and molding encapsulation material. The cap should include a hole located away from the pressure sensor device, so that external gas pressure can be experienced by the pressure sensor device. Adding a silicon cap, however, is expensive. The silicon cap would need to be joined to the structure supporting the pressure sensor device via a bonding process, which may require a bonding material made of glass frit or a metal in contact with the structure and the silicon cap to ensure joinder therebetween before the encapsulation process. Some pressure sensors require a silicone gel to protect components (e.g., wire bonds) from exposure to moisture and other elements of the environment. A drawback of using gel is that it relatively costly, and a significant amount of gel is required. Another costly step in the manufacture of packaged pressure sensors is the use of films in film-assisted molding of the package. Once used, the film cannot be used again. The present disclosure overcomes the need for a cap covering the cavity, gel, and film-assisted molding.

Figure 5:
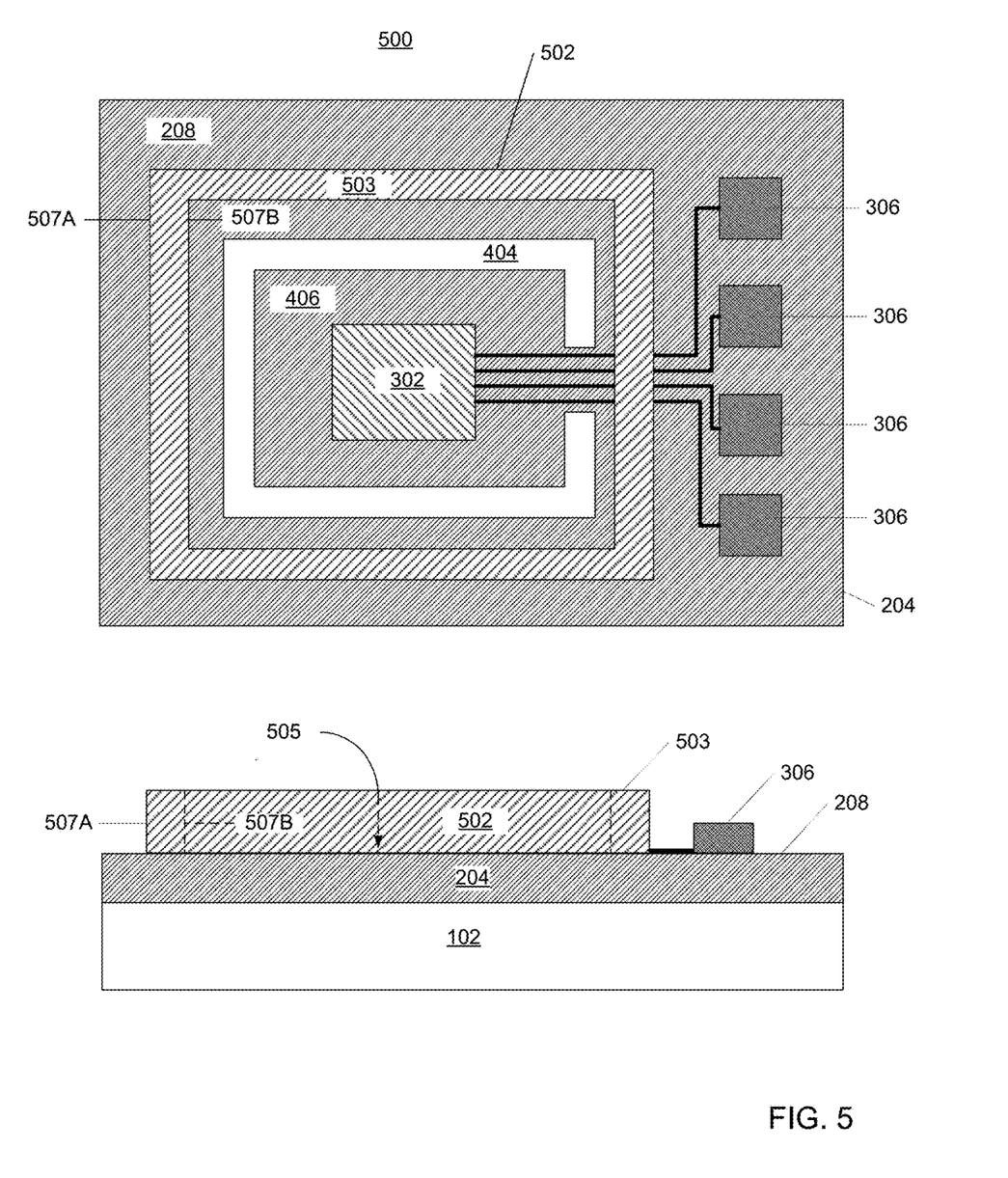
FIG. 5 illustrates top and side views of the structure shown in FIG. 4 at a subsequent stage of the manufacturing process.
Figure 6:
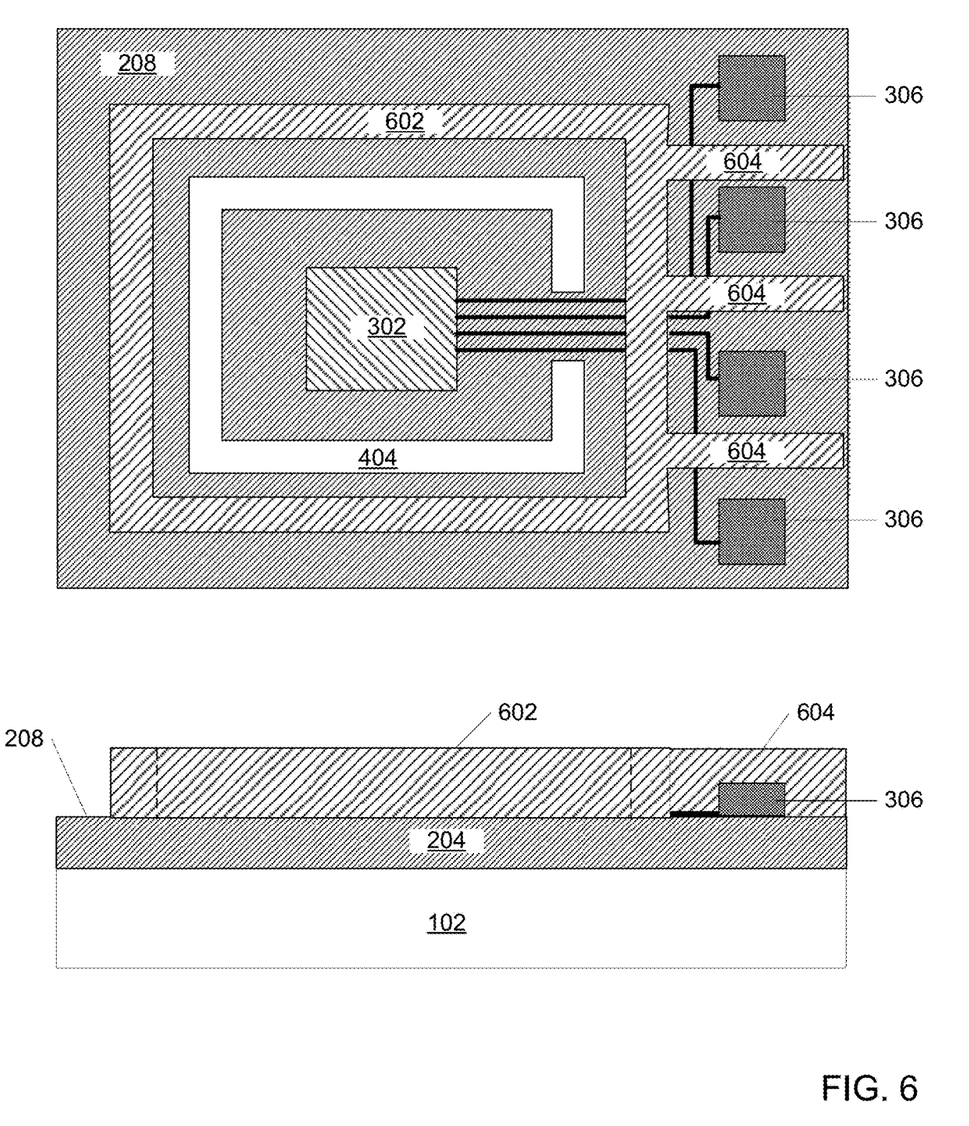
FIG. 6 shows top and side views of the structure shown in FIG. 4 with an alternative thick film polymer ring.

FIG. 5 illustrates top and side views of the structure shown in FIG. 4 at a subsequent stage of the manufacturing process to create stress-isolated Pcell die 500. A thick-film, flexible, conductive or non-conductive polymer ring 502 is formed on first substrate 204 as shown. It is noted that ring 502 is square-shaped in the example embodiment and is approximately 200 microns thick. In other embodiments the thick-film, flexible polymer ring may take form in a circular shaped device. However, for purposes of explanation only, a square shaped ring rings 502 will be presumed. Polymer ring 502 encircles pressure sensor device 302 and platform 406. Polymer ring 502 has a first flat surface 503, and an oppositely facing flat surface (not shown) that contacts the surface 208 of substrate 204. Polymer ring 502 has parallel side walls 507 that are perpendicular or substantially perpendicular to surface 208 of second substrate 204. The inner side wall 507B creates a cavity 505 for pressure sensor device 302. In one embodiment, ring 502 can be created by applying a thick and flexible film of polymer (polytetrafluoroethylene, perfluoroalkoxy, etc.) to the wafer containing the structure of FIG. 4, making a bond between the thick film polymer and the second substrate 204. The bond can be created by heating the combination in one embodiment. Once the polymer film is bonded to the surface 208 of substrate 204, ring 502 can then be formed by imaging holes in the polymer film using known photolithography techniques, followed by a chemical or dry etch removal of portions of the thick film. Alternatively, a sheet of thick film polymer rings 502 can be formed prior to attachment of the sheet to the wafer containing the structure of FIG. 4 using standard manufacturing techniques. Assuming proper alignment between the sheet of preformed thick film rings 502 and the wafer, a bond is created between the polymer and the second substrate 204. The bond can be created by heating the rings 502 and wafer in one embodiment. The polymer rings will remain flexible after heating, and will be flexible enough at mold temperatures (~175° C.) to maintain a seal with the mold during a subsequent encapsulation process more fully described below. FIG. 6 shows top and side views of the structure shown in FIG. 4 with an alternative thick film, flexible, conductive or non-conductive polymer ring 602 bonded thereto. This alternative thick film polymer ring 602 includes fingers 604 that extend between bond pads 306. In one embodiment, fingers 604 can provide insulation between wire bonds that will be subsequently added to connect bond pads 306 to bond pads of an underlying control circuit (e.g., control die). In one embodiment, ring 602 and fingers 604 are formed of a conductive polymer (e.g., a conductive particle (such as Ag, Cu, Ni) filled polymer) that provide EMC isolation. In another embodiment, ring 602 is a non-conductive polymer, while fingers 604 are conductive polymer. In still another embodiment, ring 602 and fingers 604 are non-conductive polymer, but fingers 604 can be subsequently metallized to become conductive using any one of many known techniques such as sputtering, plating, inkjet printing, etc. If conductive, ring 602 and/or one or more of fingers 604 may be electrically coupled to a grounded bond pad, which could be formed on surface 208 and under the ring 602 or one of the fingers 604.

Ultimately, polymer ring 502 or 602 is used during package encapsulation to create an encapsulation cavity for pressure sensor device 302. Importantly, use of a flexible polymer ring 502 or 602 eliminates the use of expensive film during package molding, and the polymer ring 502 or 602 create seals between the polymer ring and a mold, and between the polymer ring and second substrate 204 that prevents mold compound from flowing into polymer cavity 505.

Figure 7:
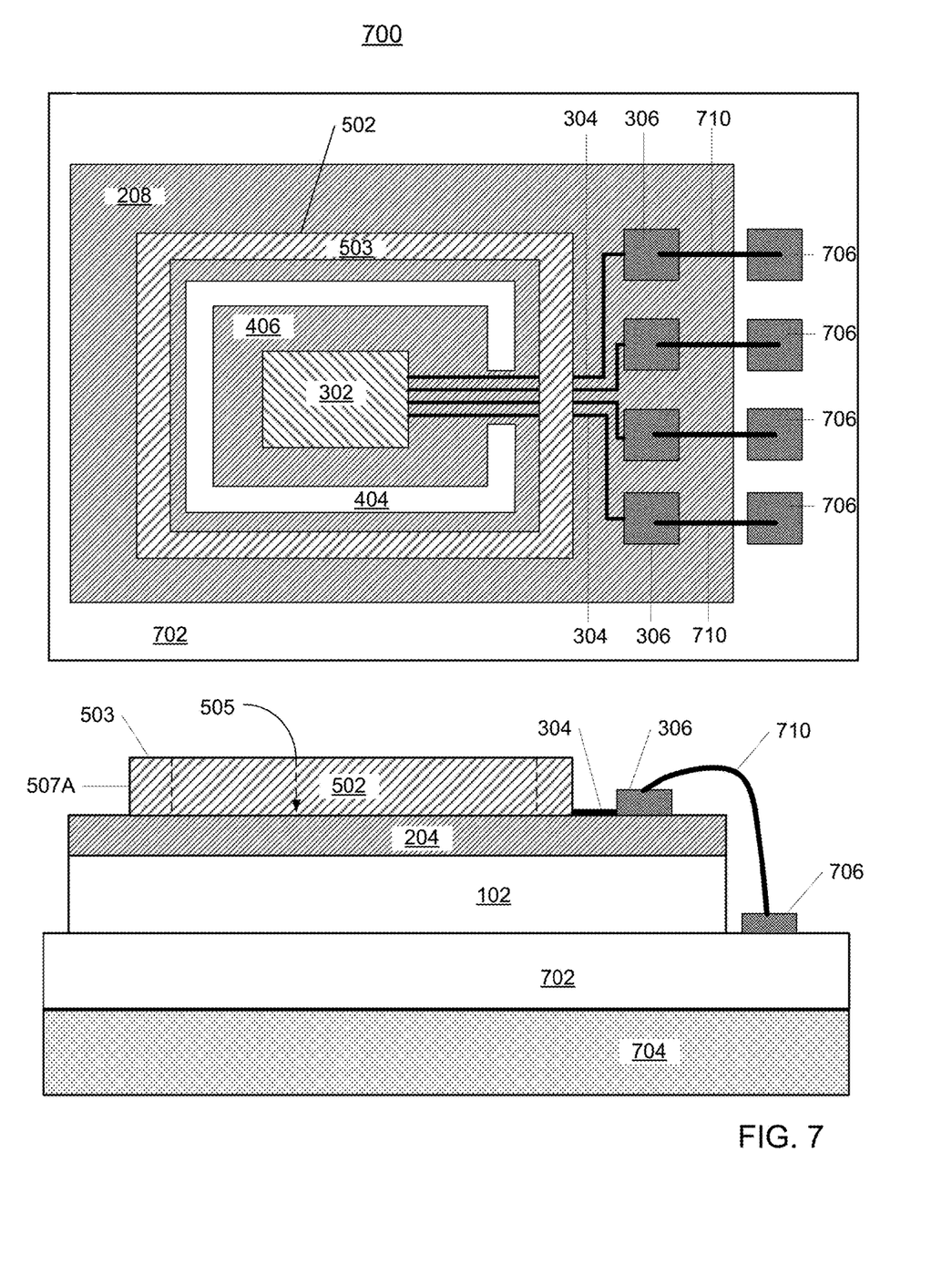
FIG. 7 shows a top view and a side view of the device of FIG. 5 after wafer dicing.

The wafer containing the stress-isolated Pcell 500 in FIG. 5 or 6 can be diced to yield individual or groups of stress-isolated Pcell dies. The wafer may be upside down during dicing to prevent debris from entering cavity 505 during the dicing process. FIG. 7 shows a top view and a side view of a structure 700 that includes the stress-isolated Pcell die structure of FIG. 5 after wafer dicing, and after it is mounted on an integrated circuit control die 702, which in turn is mounted on a lead frame 704. Control die 702 can take the form of, for example, an application specific integrated circuit or another type of signal processor, and includes bond pads 706 that are connected to bond pads 306 of the stress-isolated Pcell die 500 via wire bonds 710. Although not shown, additional wire bonds may provide data communication between control die 702 and lead frame 704.

Figure 8:
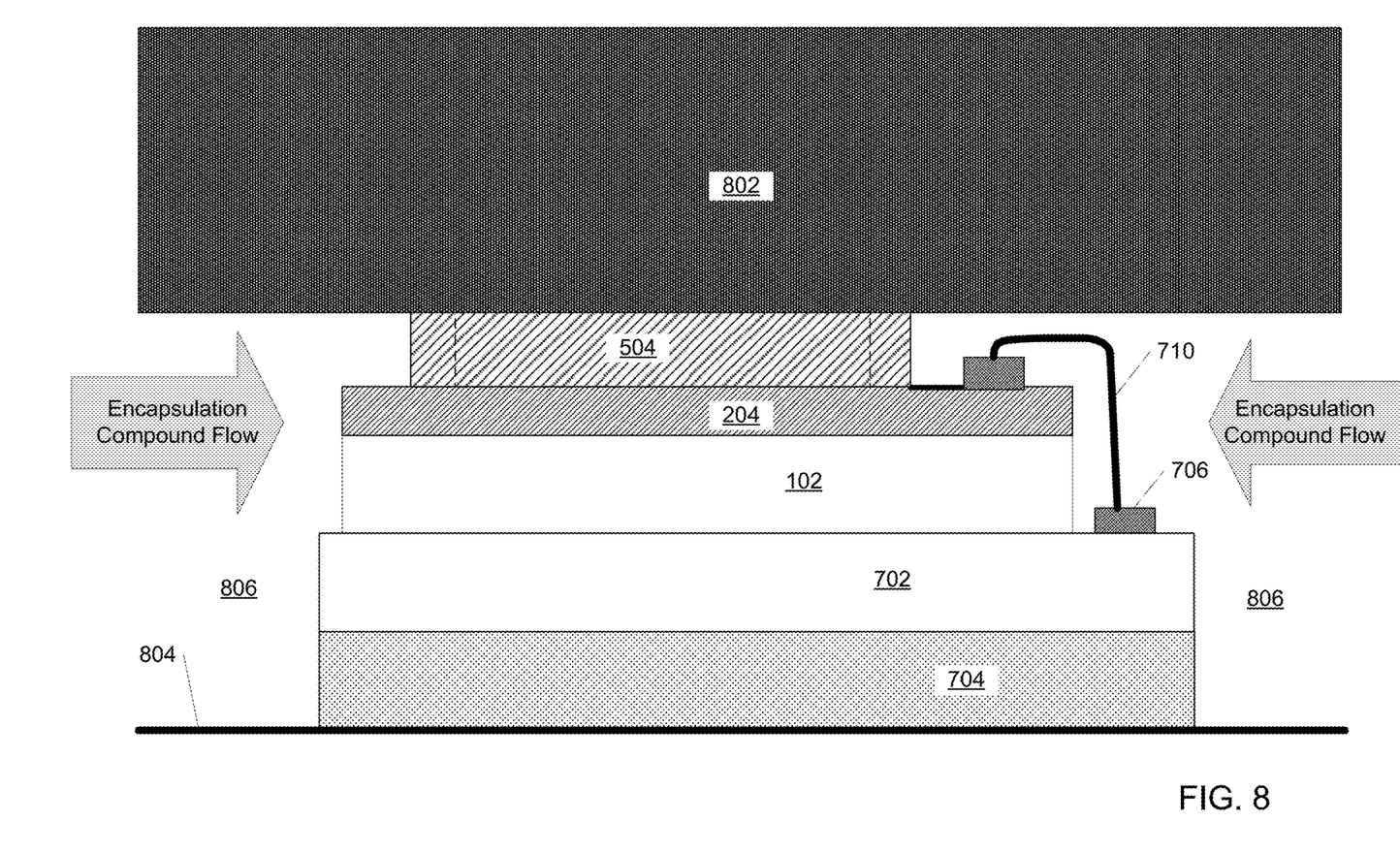
FIG. 8 illustrates the device shown within FIG. 7 during one type encapsulation process to create a molded body.

A molded body can be formed at least partially around the structure 700 shown in FIG. 7, which creates a molded body cavity that is concentric with the polymer cavity 505. The molded body encapsulates bond pads 306 and 706 as well as wire bonds 710. The molded body can sufficiently protect components, including wire bonds 710, so that a gel fill, which may be used with prior art packages, is not needed. FIG. 8 illustrates the structure 700 shown within FIG. 7 during a stage of one type encapsulation process to create the molded body. In particular, the structure 700 is resting on the surface 804 of the machine that includes a mold 802 that contacts the upper surface 503 of flexible polymer ring 502 while an encapsulation mold compound (e.g., molten epoxy mold compound) flows into the mold cavity 806. Mold 802 contacts the upper surface 503 of the polymer ring to create a seal that prevents encapsulation mold compound from flowing into cavity 505 that is created by the polymer ring 502. The mold compound is subsequently cured to create a hardened body around structure 700.

Figure 9:
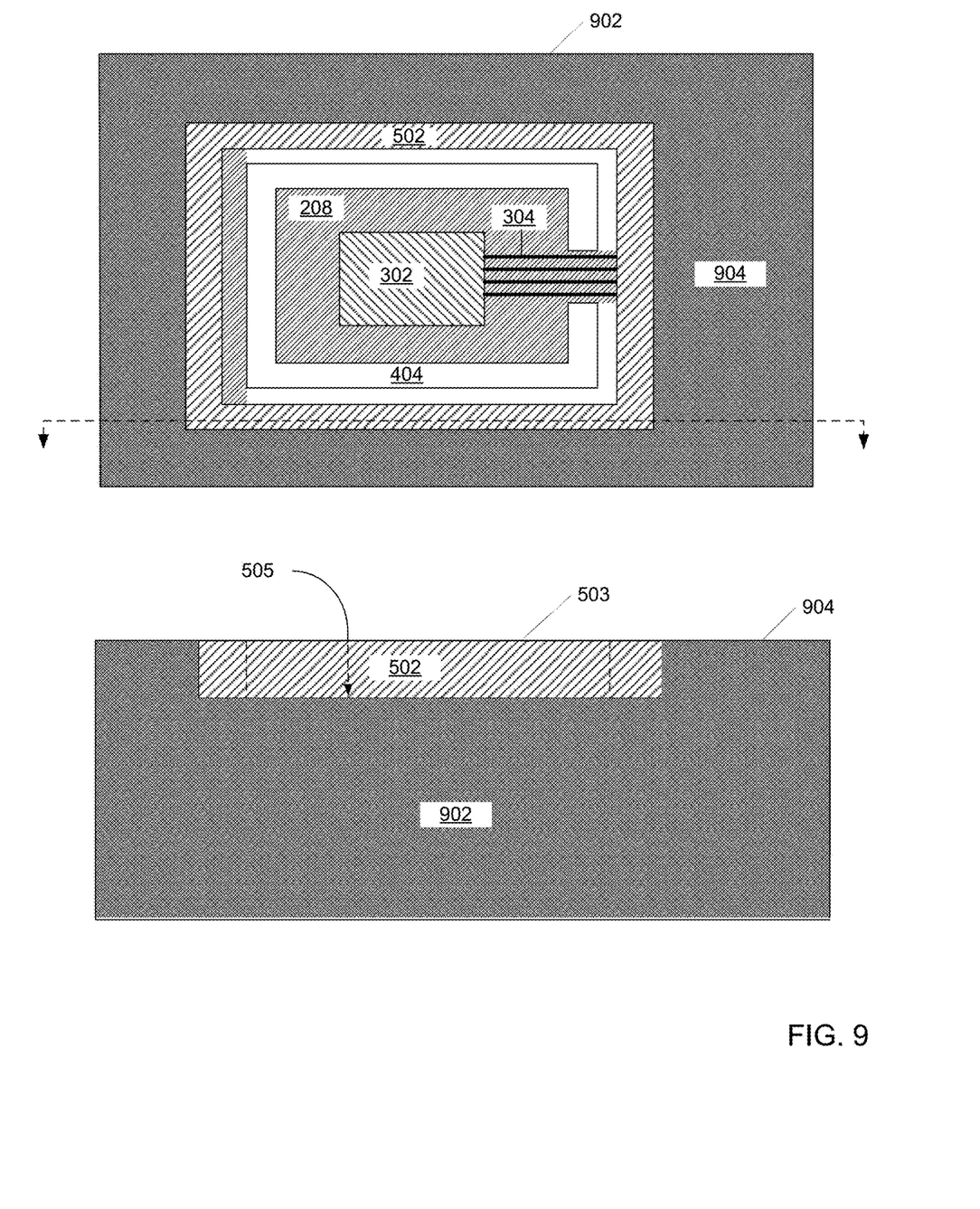
FIG. 9 is a top and sectional side view of a stress-isolated pressure sensor die after the encapsulation process to create molded body.

FIG. 9 is a top and sectional side view of structure 700 after the encapsulation process to create molded body 902. A first surface 904 of molded body 902 is flush or substantially flush with surface 503 of polymer ring 502. As can be seen in this figure, cavity 505 is preserved by virtue of the polymer ring 502 during the encapsulation process. In this configuration, pressure sensor device 302 is in fluid communication with its environment via cavity 505. The resulting package, which includes molded body 902, provides a means for connecting the MEMS pressure sensor device 302 and control die 702 of the package, to devices in the external environment, such as printed circuit board, via leads (not shown) of lead frame 704.

In one embodiment, a package is disclosed that includes a microelectromechanical system (MEMS) die including a first substrate, which includes a first surface on which is formed a MEMS device. A polymer ring is bonded to the first surface of the first substrate to create a first cavity in which the MEMS device is contained. The package also includes a molded compound body comprising a second cavity that is concentric with the first cavity to enable fluid communication between the MEMS device and an environment external to the package. The polymer ring may include an inner wall extending between first and second oppositely facing surfaces, wherein the first surface of the polymer ring is bonded to the first surface of the first substrate. The molded compound body may include a first surface that is flush with the second surface of the polymer ring. The first surface of the polymer ring can bonded to the first surface of the first substrate.

A seal can be formed between the first surface of the polymer ring and the first substrate, which inhibits flow of molding compound into the first cavity during an encapsulation process. The MEMS die may include a second substrate that includes a first recess. The first substrate may further include a cantilevered platform structure having a platform and an arm extending from said platform, wherein said platform and said arm are suspended over the first recess. The MEMS device can be formed on the platform, and the polymer ring can be bonded to the arm but not the platform. The MEMS die may include a conductive trace formed on the platform and the arm, wherein the polymer ring contacts a portion of the conductive trace formed on the arm, but not a portion of the conductive trace formed on the platform. The MEMS die can be mounted on a control die including bond pads, wherein the MEMS die includes bond pads formed on the first surface, wherein package further includes a bond wire that connects one of the control die bond pads to one of the first surface bond pads, and wherein the molded compound body encapsulates the bond wire. The polymer ring may include a finger extending laterally between a pair of the first surface bond pads. The MEMS device can be a pressure sensor.

Also disclosed is a method of forming a packaged device, that includes applying a polymer film to a wafer containing microelectromechanical system (MEMS) dies, wherein each of the MEMS dies includes a first surface on which is formed a MEMS device. Thereafter, a portion of the polymer film is removed to create a ring, wherein the polymer ring creates a first cavity in which the MEMS device is contained. The method may further include heating the wafer before removing the portion of polymer ring in order to bond the polymer film to the first surface. The method may further include dicing the wafer to separate the MEMS dies, affixing one of the separated MEMS die to an integrated circuit (IC) die, affixing the IC die to a lead frame after the affixing one of the separated MEMS dies to the IC die, connecting bond pads on the MEMS die to bond pads on the IC die using wire bonds, contacting the polymer ring with a mold to create a seal between the mold and the polymer ring, and encapsulating a portion of the MEMS die and wire bonds with a molding compound while the polymer ring contacts the mold. The polymer ring in the method may include an inner wall extending between first and second oppositely facing surfaces, wherein the first surface of the polymer ring is bonded to the first surface. The method may further include curing the molding compound to create a molded compound body, wherein the molded compound body includes a second cavity that is concentric with the first cavity to enable fluid communication between the MEMS device and an environment external to the packaged device.

In another embodiment, an apparatus is disclosed that includes a microelectromechanical system (MEMS) die comprising a first substrate, which includes a first surface on which is formed a pressure sensor device, and a polymer ring bonded to the first surface of the first substrate to create a first cavity in which the pressure sensor device is contained. The apparatus may further include a molded compound body, which includes a second cavity that is concentric with the first cavity to enable fluid communication between the pressure sensor device and an environment external to the package. The polymer ring may include an inner wall extending between first and second oppositely facing surfaces, wherein the first surface of the polymer ring is bonded to the first surface of the first substrate. The molded compound body may include a first surface that is flush or substantially flush with the second surface of the polymer ring. The MEMS die may include a second substrate that includes a first recess, the first substrate may further include a cantilevered platform structure having a platform and an arm extending from said platform, wherein said platform and said arm are suspended over the first recess, wherein the pressure sensor device is formed on the platform, and wherein the polymer ring is bonded to the arm but not the platform.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Further, the phraseology or terminology employed herein is for the purpose of description and not of limitation. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A package comprising:
    a microelectromechanical system (MEMS) die comprising a first substrate, which comprises a first surface on which is formed a MEMS device;
    a second substrate comprising a first recess formed at a first side and not extending through the second substrate, a second surface of the first substrate affixed to the first side of the second substrate such that the recess is located below the MEMS device;
    a polymer ring bonded to the first surface of the first substrate to create a first cavity in which the MEMS device is contained;
    a molded compound body formed adjacent to outer sidewalls of the polymer ring, the first cavity void of mold compound to enable fluid communication between the MEMS device and an environment external to the package.

2. The package of claim 1 wherein the polymer ring comprises an inner wall extending between first and second oppositely facing surfaces, wherein the first surface of the polymer ring is bonded to the first surface of the first substrate.

3. The package of claim 2 wherein the molded compound body comprises a first surface that is flush with the second surface of the polymer ring.

4. The package of claim 3 wherein the first surface of the polymer ring is bonded to the first surface of the first substrate.

5. The package of claim 1 wherein a seal is formed between the first surface of the polymer ring and the first substrate, which inhibits flow of molding compound into the first cavity during an encapsulation process.

6. The package of claim 1:
wherein the first substrate further comprises a cantilevered platform structure having a platform and an arm extending from said platform, wherein said platform and said arm are suspended over the first recess;
wherein the MEMS device is formed on the platform;
wherein the polymer ring is bonded to the arm but not the platform.

7. The package of claim 6:
wherein the MEMS die comprises a conductive trace formed on the platform and the arm;
wherein the polymer ring contacts a portion of the conductive trace formed on the arm, but not a portion of the conductive trace formed on the platform.

8. The package of claim 6:
wherein the MEMS die is mounted on a control die comprising bond pads;
wherein the MEMS die comprises bond pads formed on the first surface;
wherein package further comprises a bond wire that connects one of the control die bond pads to one of the first surface bond pads;
wherein the molded compound body encapsulates the bond wire.

9. The package of claim 8 wherein the polymer ring comprises a finger extending laterally between a pair of the first surface bond pads.

10. The package of claim 1 wherein the MEMS device is a pressure sensor.

11. An apparatus comprising:
a microelectromechanical system (MEMS) die comprising a first substrate, which comprises a first surface on which is formed a pressure sensor device;
a second substrate comprising a first recess formed at a first side and not extending through the second substrate, a second surface of the first substrate affixed to the first side of the second substrate such that the recess is located below the pressure sensor device; and
a polymer ring bonded to the first surface of the first substrate to create a first cavity in which the pressure sensor device is contained.

12. The apparatus of claim 11 further comprising a molded compound body, which comprises a second cavity that is concentric with the first cavity to enable fluid communication between the pressure sensor device and an environment external to the package.

13. The apparatus of claim 12 wherein the polymer ring comprises an inner wall extending between first and second oppositely facing surfaces, wherein the first surface of the polymer ring is bonded to the first surface of the first substrate.

14. The apparatus of claim 13 wherein the molded compound body comprises a first surface that is flush or substantially flush with the second surface of the polymer ring.

15. The apparatus of claim 14:
wherein the first substrate further comprises a cantilevered platform structure having a platform and an arm extending from said platform, wherein said platform and said arm are suspended over the first recess;
wherein the pressure sensor device is formed on the platform;
wherein the polymer ring is bonded to the arm but not the platform.

* * * * *